United States Patent
Tomai et al.

(10) Patent No.: US 11,434,172 B2
(45) Date of Patent: Sep. 6, 2022

(54) SINTERED BODY

(71) Applicant: IDEMITSU KOSAN CO., LTD., Chiyoda-ku (JP)

(72) Inventors: Shigekazu Tomai, Sodegaura (JP); Yoshihiro Ueoka, Sodegaura (JP); Satoshi Katsumata, Sodegaura (JP); Kenichi Sasaki, Sodegaura (JP); Masashi Oyama, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 0 days.

(21) Appl. No.: 17/289,975

(22) PCT Filed: Oct. 30, 2019

(86) PCT No.: PCT/JP2019/042519
§ 371 (c)(1),
(2) Date: Apr. 29, 2021

(87) PCT Pub. No.: WO2020/090867
PCT Pub. Date: May 7, 2020

(65) Prior Publication Data
US 2022/0002205 A1 Jan. 6, 2022

(30) Foreign Application Priority Data
Oct. 31, 2018 (JP) .............................. JP2018-204949

(51) Int. Cl.
*H01B 1/08* (2006.01)
*C04B 35/453* (2006.01)

(52) U.S. Cl.
CPC ............. *C04B 35/453* (2013.01); *H01B 1/08* (2013.01)

(58) Field of Classification Search
CPC .......... H01B 1/08; C04B 35/04; C04B 35/453
(Continued)

(56) References Cited

U.S. PATENT DOCUMENTS

2009/0101493 A1* 4/2009 Nakayama .......... H01L 31/1884
204/298.13
2010/0209686 A1* 8/2010 Sekiwa ............. H01L 21/02565
117/66
(Continued)

FOREIGN PATENT DOCUMENTS

| CN | 101168837 | 4/2008 |
| CN | 101460425 | 6/2009 |

(Continued)

OTHER PUBLICATIONS

English language machine translation of JP 2009-184898 A (pub Aug. 2009).*
(Continued)

*Primary Examiner* — Mark Kopec
(74) *Attorney, Agent, or Firm* — Oblon, McClelland, Maier & Neustadt, L.L.P.

(57) ABSTRACT

A sintered body, containing zinc, magnesium and oxygen as constituent elements, wherein the atomic ratio of zinc to the sum of zinc and magnesium [Zn/(Zn+Mg)] is 0.20 to 0.75, the atomic ratio of magnesium to the sum of zinc and magnesium [Mg/(Zn+Mg)] is 0.25 to 0.80, and the sintered body consists of a single crystal structure as measured by X-ray diffraction.

8 Claims, 2 Drawing Sheets

(58) Field of Classification Search
USPC .................. 252/519.51; 204/192.15
See application file for complete search history.

(56) References Cited

U.S. PATENT DOCUMENTS

| | | | |
|---|---|---|---|
| 2011/0180763 A1* | 7/2011 | Utsuno | H01L 29/242 252/512 |
| 2013/0108890 A1 | 5/2013 | Rou et al. | |
| 2013/0177762 A1* | 7/2013 | Nakayama | C23C 14/3414 428/338 |

FOREIGN PATENT DOCUMENTS

| | | |
|---|---|---|
| CN | 101818324 A | 9/2010 |
| CN | 102312193 | 1/2012 |
| CN | 103205706 | 7/2013 |
| CN | 103748055 | 4/2014 |
| EP | 1 887 100 A1 | 2/2008 |
| EP | 2767610 A1 * | 8/2014 |
| JP | 2009-184898 A | 8/2009 |
| JP | 2010-24107 A | 2/2010 |
| JP | 2013-126944 A | 6/2013 |
| JP | 2016-190757 A | 11/2016 |
| TW | 201309823 | 3/2013 |
| WO | WO 2007/141994 A1 * | 12/2007 |
| WO | WO 2012/014688 A1 | 2/2012 |
| WO | WO2014069367 | 5/2014 |

OTHER PUBLICATIONS

English language machine translation of JP 2010-24107 A (pub Feb. 2010).*
Katoaka et al "Lithium-ion conducting oxide single crystal as solid electrolyte for advanced lithium battery application", Scientific Reports (2018) 8:9965.*
Zhuang et al "Domain matching epitaxy of cubic $Mg_xZn_{1-x}O$ films in $LaAlO_3$ by oulsed laser deposition", Appl. Phys. A 89, 543-546 (2007).*
International Search Report dated Dec. 24, 2019 in PCT/JP2019/042519, 2 pages.
International Preliminary Report on Patentability and Written Opinion dated Apr. 27, 2021 in PCT/JP2019/042519 (submitting English translation only), 7 pages.
Extended European Search Report dated Jun. 30, 2022 in European Patent Application No. 19878562.8.
Chinese Office Action dated Jun. 1, 2022 in Chinese Patent Application 201980072532.7. (No English language translation).
ZnO: Doping and Application, Zhejiang University Press, 4 pgs. (No pub date or English translation).

* cited by examiner

SINTERED BODY

TECHNICAL FIELD

The invention relates to a sintered body, a tablet for film formation, and a sputtering target used in the formation of a thin film.

BACKGROUND ART

Oxide thin films are used as thin films with light transmittance. Oxide thin films, for example, are used in the electrode of semiconductor devices such as a light-emitting diode.

MgO—ZnO-based oxides have been applied to color liquid crystal projectors as translucent ceramics (for example, see Patent Document 1). A sintered body for ZnO—MgO-based sputtering target which contains 3 to 50 mol % of Mg in MgO equivalent, has a maximum particle size of 10 µm or less in the MgO phase (including MgO-rich solid solution phase), and has a uniformly dispersed structure is disclosed (see Patent Document 2). In this document, the resulting thin film is used as a window material for solar cells.

When a molded body containing zinc oxide and magnesium oxide is sintered, depending on the mixing ratio, the oxidation of the sintered body after sputtering or vapor deposition may become uneven, resulting in the problem of the formation of color differences between the periphery and the center or between the surface and the interior (precipitation of zinc and generation of color unevenness such as nodules). The sintered body in which the color unevenness is generated is not suitable as a material for film formation such as a sputtering target and a tablet in which the uniformity of the material is required.

In the material for film formation in which color unevenness is generated, a step of scraping all color unevenness portion of the surface of the sintered body by polishing is required. Therefore, there is a problem that the scraped material is wasted, and an additional step for polishing is required.

Even if color unevenness is scraped off, there is a problem that color unevenness is likely to be generated again in the erosion portion and the periphery portion by sputtering.

As described above, there is a problem that the manufacturing step becomes complicated and the manufacturing cost becomes high due to the generation of color unevenness.

RELATED ART DOCUMENTS

Patent Documents

[Patent Document 1] JP 2009-184898 A
[Patent Document 2] WO 2012/014688 A1

SUMMARY OF THE INVENTION

It is an object of the invention to provide material for film formation capable of suppressing the generation of color unevenness during film formation and reducing abnormal discharges.

According to one embodiment of the invention, the following sintered body and the like are provided.

1. A sintered body, comprising zinc, magnesium, and oxygen as constituent elements, wherein
   the atomic ratio of zinc to the sum of zinc and magnesium [Zn/(Zn+Mg)] is 0.20 to 0.75,
   the atomic ratio of magnesium to the sum of zinc and magnesium [Mg/(Zn+Mg)] is 0.25 to 0.80, and
   the sintered body consists of a single crystal structure as measured by X-ray diffraction.
2. The sintered body according to 1, wherein the atomic ratio of zinc is 0.20 to 0.49 and the atomic ratio of magnesium is 0.51 to 0.80.
3. The sintered body according to 1 or 2, wherein the single crystal structure is a cubic crystal of MgO.
4. A tablet for film formation, comprising the sintered body according to any one of 1 to 3.
5. A sputtering target, comprising the sintered body according to any one of 1 to 3.

According to one embodiment of the invention, it is possible to provide material for film formation capable of suppressing the generation of color unevenness during film formation and reducing abnormal discharges.

MODE FOR CARRYING OUT THE INVENTION

Figure 1:
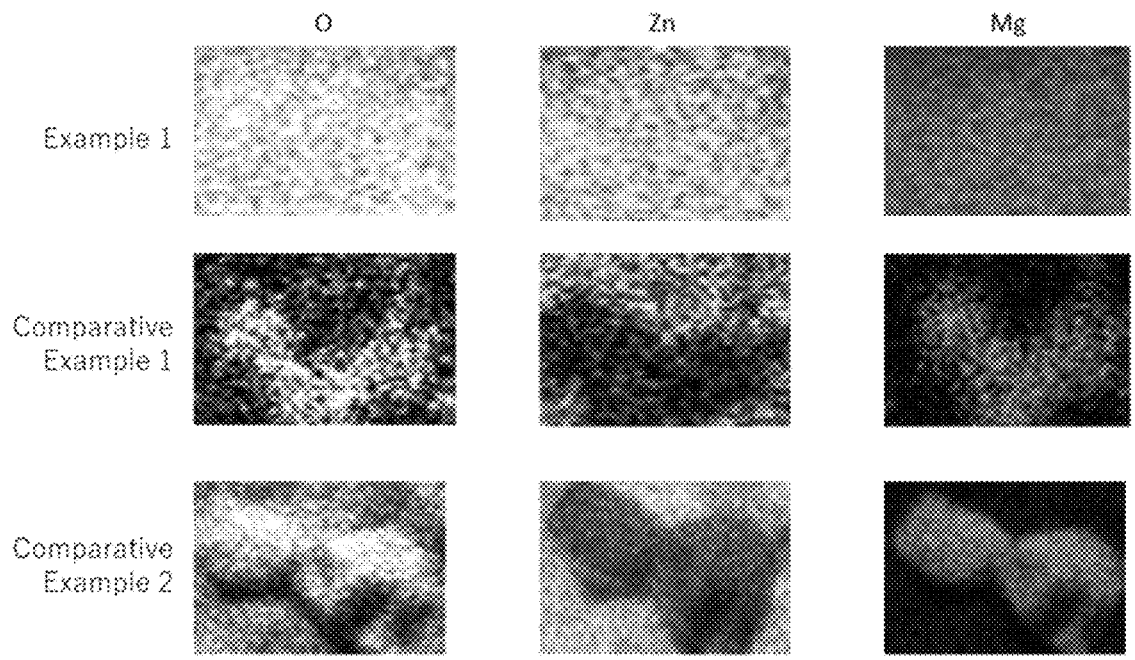
FIG. 1 is element mappings by EPMA of the sintered bodies produced in Example 1 and Comparative Examples 1 and 2.

The sintered body according to one embodiment of the invention contains zinc, magnesium, and oxygen as constituent elements, and consists of a single crystal structure as measured by X-ray diffraction. Here, "consists of a single crystal structure as measured by X-ray diffraction" refers to the case where the crystal structure mainly consists of only one crystal structure whose existence is confirmed by WPF (total pattern fitting) and Rietveld analysis of the results of X-ray diffraction measurement.

In addition to the main crystal structure, even if a trace amount of the crystal structure is confirmed, when the intensity ratio of the peak intensity of the maximum peak among diffraction peaks derived from other crystal structures ($I_0$) to the peak intensity of the maximum peak among diffraction peaks derived from the main crystal structure ($I_1$) ($I_0/I_1$) is 0.01 or less, it is determined that the crystal structure mainly consists of only one crystal structure. Diffraction peaks derived from other crystal structures are preferably not observed.

For example, when the single crystal structure is a cubic crystal of MgO, diffraction peaks are observed at $2\theta=37.0\pm1.0$ deg, $43.0\pm1.0$ deg, and $62.3\pm1.0$ deg in the X-ray diffraction pattern. Of these, the maximum peak is observed at $2\theta=43.0\pm1.0$ deg. The peak intensity of this peak ($I_1$) is compared with the peak intensity of the largest peak among the diffraction peaks derived from other crystal structures ($I_0$).

In the present embodiment, examples of the single crystal structure include, for example, a cubic crystal of MgO. The cubic crystal of MgO can be confirmed by, for example, JCPDS Card: 75-0447.

The sintered body of the embodiment may have a single crystal structure, and may partially contain amorphous components.

The fact that the sintered body of the embodiment contains zinc, magnesium, and oxygen as constituent elements can be confirmed by an electrons probe micro analyzer (EPMA). It is considered that zinc, magnesium, and oxygen mainly constitute a mixed crystal (solid solution of magnesium oxide and zinc oxide) in which part of magnesium of magnesium oxide is substituted by zinc.

In the present embodiment, it is preferable that oxygen be uniformly dispersed. The fact that oxygen is uniformly dispersed can be determined by confirming the result of analyzing the oxygen element in the element mapping obtained by observing the surfaces of the sintered bodies using an electrons probe micro analyzer (EPMA). In the present application, in the element mapping, when the region of 3 μm×5 μm square is uniformly dispersed in the dark portion and the light portion as in the element mapping of Example 1 (FIG. 1), it is determined that oxygen is uniformly dispersed. On the other hand, as in Comparative Examples 1 and 2, when the dark portion and the light portion are clearly separated and aggregated, it is determined that oxygen is not uniformly dispersed.

In the present embodiment, the atomic ratio of zinc to the sum of zinc and magnesium [Zn/(Zn+Mg)] is 0.20 to 0.75, the atomic ratio of magnesium to the sum of zinc and magnesium [Mg/(Zn+Mg)] is 0.25 to 0.80. In this range, oxygen in the sintered body is more uniformly dispersed, and the effect of suppressing color unevenness after film formation is further increased. If the atomic ratio of zinc exceeds 0.75, the mixture tends to be a mixture of a cubic crystal of MgO and a hexagonal crystal of ZnO, and oxygen tends to be unevenly distributed on the magnesium side. For this reason, color unevenness such as nodules is likely to be generated at the time of film formation in some cases. Further, zinc is likely to be reduced when sputtered, which may cause abnormal discharge. If the atomic ratio of zinc is less than 0.20, in addition to the MgZnO phase observed as a cubic crystal of MgO, color unevenness such as zinc metal is precipitated during film formation is likely to be generated, which may cause abnormal discharge.

The atomic ratio of zinc is preferably 0.20 to 0.49, and more preferably 0.25 to 0.45. The atomic ratio of magnesium is preferably 0.51 to 0.80, and more preferably 0.55 to 0.75. The atomic ratio of zinc and magnesium can be controlled by adjusting the atomic ratio in the starting material. Compared to the atomic ratio in the raw material, the atomic ratio of the sintered body tends to have a higher ratio of zinc. The reason why the atomic ratio of magnesium is 0.51 to 0.80 is more preferable is that both conductivity and ultraviolet transmittance can be achieved when a film produced using a sintered body is used as an ultraviolet transparent electrode. When the atomic ratio of magnesium is less than 0.51, the ultraviolet transmittance decreases. When the atomic ratio of magnesium exceeds 0.80, the conductivity decreases.

In the present application, the atomic ratio of zinc and magnesium can be measured by X-ray diffraction, fluorescent X-ray analysis, or inductively coupled plasma (ICP) emission spectroscopy.

The sintered body of the present embodiment may further contain a positive trivalent metal oxide. The positive trivalent means that the valance of the metal atom in the metal oxide is +3. By containing a positive trivalent metal oxide, electric resistance can be reduced when a thin film is formed. Examples of the metal oxide preferable as a positive trivalent metal oxide include $Al_2O_3$, $Ga_2O_3$, and the like. These metal oxides are known as a material for enhancing the conductivity of ZnO, but they are also useful as additives for enhancing the conductivity of ZnO in the present embodiment.

The preferred addition amount of the oxide of the positive trivalent metal X is 0.001 to 0.1, more preferably 0.01 to 0.07, and still more preferably 0.02 to 0.05, in the metal atomic ratio [X/(X+Zn+Mg)].

The constituent elements of the sintered body of the present embodiment may consist essentially of Mg, Zn, O, and optionally a positive trivalent metal element. For example, 70 mol % or more, 80 mol % or more, or 90 mol % or more of the constituent elements of the sintered body of the present embodiment may be Mg, Zn, O, and optionally a positive trivalent metal element. The constituent elements of the sintered body of the present embodiment may consist of Mg, Zn, O, and optionally a positive trivalent metal element. In this case, unavoidable impurities may be included.

The sintered body of the present embodiment can be produced, for example, by the following steps: mixing a raw material powder to prepare a mixed powder, molding the mixed powder to form a molded body, and firing the molded body.

As the starting material, a powder of a compound containing Mg, a powder of a compound containing Zn, and optionally a powder of a compound containing a positive trivalent metal can be used. The compounds are preferably oxides. Examples include MgO, ZnO, $Al_2O_3$, and $Ga_2O_3$.

The mixing ratio of the raw material powders can be adjusted by considering, for example, the atomic ratio of the sintered body to be obtained.

The mean particle size of the raw material powder is preferably 0.1 to 1.2 μm, and more preferably 0.5 to 1.0 μm. The mean particle size of the raw material powder can be measured by laser diffraction particle size distributor or the like.

The methods for mixing and molding the raw materials are not limited, and any known method can be employed. In addition, a binder may be added when mixing.

The mixing of the raw materials may be performed using any known devices such as, for example, a ball mill, a bead mill, a jet mill, or an ultrasonic device. The mixing time may be appropriately adjusted, and is preferably about 6 to 100 hours.

The method for molding may be, for example, a molded body by pressure molding a mixed powder. This step allows the product to be formed into a product shape (e.g., a shape suitable as a sputtering target).

The molded body can be obtained usually by mold pressing or cold isostatic pressing (CIP) by filling the mold with the mixed powder and applying pressure thereon, for example with 1000 kg/cm² or more.

Note that, at the time of molding, molding aids such as polyvinyl alcohol, polyethylene glycol, methylcellulose, polywax, oleic acid, or stearic acid may be used.

The resulting molded body can be heated at a temperature of 1200 to 1650° C. for 2 hours or more to obtain a sintered body, for example.

The heating temperature is preferably 1350 to 1600° C., more preferably from 1400 to 1600° C., and still more preferably 1450 to 1500° C. The heating time is preferably 2 to 72 hours, more preferably 3 to 48 hours, and still more preferably 4 to 24 hours.

In the firing, the molded body is usually heated in an air atmosphere or an oxygen gas atmosphere. The oxygen gas atmosphere is preferably an atmosphere having an oxygen concentration of, for example, 10 to 50% by volume.

The sintered body of the present embodiment can be suitably used as a material for forming a thin film having compositions of the sintered body, for example, as a tablet or sputtering target used for film formation by a vacuum deposition process or an ion plating method. The thin film obtained from the material for film formation of the present embodiment can be used as a transparent conductive film used in the electrode substrate such as an ultraviolet light-emitting diode, an ultraviolet light-emitting laser diode, and the like.

The tablet can be produced, for example, by cutting or polishing a sintered body obtained by molding a raw material into the desired shape and firing the sintered body. The sputtering target can be produced, for example, by cutting or polishing a sintered body and bonding it to the backing plate.

By cutting the sintered body, the uneven surface can be removed. The sintered body can be made to a specified size by cutting. The surface of the sintered body may be polished with #200, or #400, or even #800. As a result, abnormal discharge and generation of particles during sputtering can be suppressed.

After the polished sintered body is cleaned as necessary, a bonding material such as metal indium solder is applied to the bonding surface, and the sintered body is bonded to the backing plate to obtain a sputtering target.

EXAMPLES

Examples 1 to 5 and Comparative Examples 1 and 2

(A) Production of the Sintered Body

Zinc oxide (ZnO) powder having a mean particle size of 1 μm or less and magnesium oxide (MgO) powder having a mean particle size of 1 μm or less were weighed and mixed so that the atom ratio of Mg and Zn was as shown in Table 1. The mixed powder was placed in a resin-made pot, water was further added to the mixed powder, and the mixed powder was mixed in a wet ball mill for 20 hours using hard $ZrO_2$ balls as a pulverization medium. The resulting mixed slurry was taken out, filtered, dried, and granulated. The obtained granulated product was placed in a mold and formed by cold isostatic pressing at 3 ton/cm².

Then, the resulting molded body was placed in a sintering furnace. The molded body was sintered while oxygen was flowed in at a rate of 5 L/min per 0.1 m³ of the internal volume of the furnace.

The temperature in the sintering furnace was raised from room temperature to 1000° C. at 1° C./min, from 1000° C. to 1470° C. at 3° C./min, and sintered at 1470° C. for 5 hours. Thereafter, the inflow of oxygen was stopped, and the temperature in the furnace was lowered from 1470° C. to 1300° C. at 10° C./min. Then, the temperature in the furnace was maintained at 1300° C. for 3 hours while Ar was flowed in at a rate of 10 L/min per 0.1 m³ of the internal volume of the furnace. The sintered body was obtained by cooling the temperature of the furnace to room temperature.

(B) Production of the Sputtering Target

The sputtered surface of the obtained sintered body was polished with a cup grinding wheel to a diameter of 100 mm and a thickness of 5 mm. Using an In-based alloy, the backing plate was bonded to the polished sintered body to produce a sputtering target.

For each sintered body obtained, the atom ratio of Zn and Mg and the relative density are shown in Table 1.

The film formation property of the sputtering target was evaluated. Specifically, the presence or absence of abnormal discharging at the time of film formation and the presence or absence of color unevenness in the sputtering target after film formation (zinc precipitation and nodules) were evaluated. The results are shown in Table 1.

TABLE 1

|  | Atom ratio (raw material) | | Atom ratio (sintered body) | | Relative density (%) | Color unevenness | Zinc precipitation | Nodule | Abnormal discharge |
| --- | --- | --- | --- | --- | --- | --- | --- | --- | --- |
|  | Mg | Zn | Mg | Zn | | | | | |
| Example 1 | 0.80 | 0.20 | 0.72 | 0.28 | 84 | absence | absence | absence | absence |
| Example 2 | 0.65 | 0.35 | 0.60 | 0.40 | 86 | absence | absence | absence | absence |
| Example 3 | 0.40 | 0.60 | 0.30 | 0.70 | 90 | absence | absence | absence | absence |
| Example 4 | 0.53 | 0.47 | 0.48 | 0.52 | 87 | absence | absence | absence | absence |
| Example 5 | 0.57 | 0.43 | 0.52 | 0.48 | 85 | absence | absence | absence | absence |
| Comparative Example 1 | 0.90 | 0.10 | 0.84 | 0.16 | 82 | presence | presence | absence | presence |
| Comparative Example 2 | 0.33 | 0.67 | 0.23 | 0.77 | 92 | presence | absence | presence | presence |

Evaluation methods are as follows.

(1) Atom Ratio and Crystal Structure of Zn and Mg in the Sintered Body

The results of X-ray diffraction (XRD) measurements were evaluated by WPF (whole pattern fitting) and Rietveld analysis. The XRD measurement conditions were as follows.

Equipment: Ultima-III manufactured by Rigaku Corporation

X-ray: Cu-Kα ray (wavelength: 1.5406 Å, monochromated by graphite monochromator)

2θ-θ reflection method, continuous scan (1.0°/min)

Sampling interval: 0.02°

Slit DS, SS: 2/3°, RS: 0.6 mm (2) Relative Density

The relative density of the sintered body was measured based on the Archimedes method. Specifically, the weight-in-air of the sintered body was divided by volume (=the weight-in-water of the sintered body/the specific gravity of water at measurement temperature), and the percentage value of the theoretical density ρ (g/cm³) based on the following equation was used as the relative density (unit: %).

$$\rho = (C1/100/\rho 1 + C2/100/\rho 2 \ldots + Cn/100/\rho n)^{-1}$$

In the formula, C1 to Cn independently indicate the content (% by mass) of the sintered body or the constituent materials of the sintered body, and ρ1 to ρn indicate the densities (g/cm³) of the constituent materials corresponding to C1 to Cn.

Since the density and the specific gravity of each constituent substance are almost the same, the value of the specific gravity of the oxides described in the Handbook of Chemistry: Pure Chemistry I, edited by The Chemical Society of Japan, 2nd revision (Maruzen Co., Ltd.) was used.

(3) Evaluation of Film Forming Properties of the Sputtering Target

A thin film was actually formed using a sputtering target produced from the sintered body of each Example and evaluated. The film formation conditions were as follows.

A sapphire substrate (thickness: 0.5 mm) serving as a support substrate was placed in an ultrasonic cleaner, and washed with trichloroethylene for 5 min, with acetone for 5 min, with methanol for 5 min, and finally with distilled water for 5 min.

Thereafter, the supporting substrate was set in sputtering equipment (ULVAC: ACS-4000), and a film having a thickness of 100 nm was formed on the supporting substrate by using respective sputtering targets.

Ar was used for the sputtering gas, the temperature was 25° C.

The case where the abnormal discharge was not observed during film formation was classified as "absence," and the case where the abnormal discharge was observed was classified as "presence."

The presence or absence of color unevenness (zinc precipitation and nodule) on the surfaces of the sputtering targets after film formation was visually evaluated. The case where color unevenness was not observed was classified as "absence," and the case where color unevenness was observed was classified as "presence."

Element mapping

The surface of the sputtering target after film formation was observed by an electron probe micro analyzer (EPMA). FIG. 1 shows element mappings by EPMA of the sputtering targets produced in Example 1 and Comparative Examples 1 and 2. As can be recognized from FIG. 1, Mg, Zn, and O were all homogeneously dispersed in Example 1. The same results were obtained for Examples 2 to 5. On the other hand, in Comparative Examples 1 and 2, it was confirmed that O was localized on the Mg side and Zn tended to be reduced.

EPMA measuring conditions are as follows.
Equipment name: JXA-8200 manufactured by JEOL Ltd.
Measurement conditions
Acceleration voltage: 15 kV
Irradiation current: 50 nA
Irradiation time (per point): 50 mS Each element mapping in FIG. 1 shows the element density of the region of 3 μm in length and 5 μm in width, and the dark portion (black portion) indicates a low-density portion.

X-ray diffraction pattern

Figure 2:
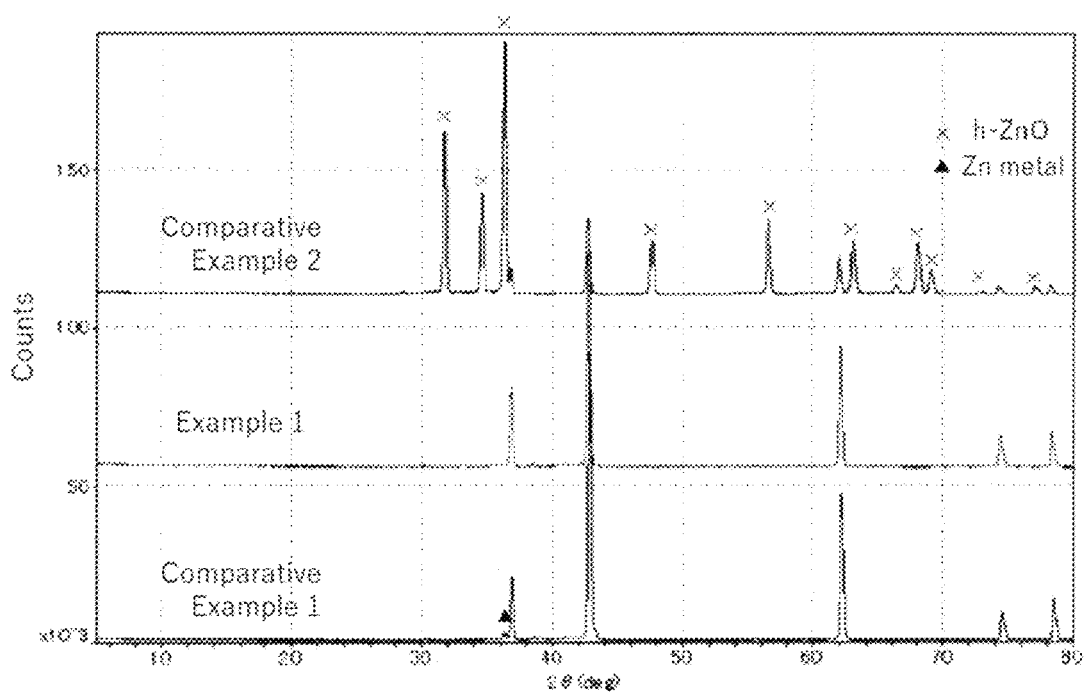
FIG. 2 is an X-ray diffraction pattern of the sintered body produced in Example 1 and Comparative Examples 1 and 2.

The X-ray diffraction pattern of the sintered body produced in Example 1 and Comparative Examples 1 and 2 shown in FIG. 2.

From the image of EPMA of FIG. 1, the sintered body of Example 1 seems to be composed of a single crystal structure in which ZnO is dissolved in MgO (a cubic crystal of MgO). The same results were obtained for Examples 2 to 5.

In Comparative Example 1, a hexagonal crystal of zinc metal was observed in addition to a cubic crystal of MgO. A peak at 2θ=36.3° was observed, which is unique to zinc metal. The peak intensity ratio of the peak intensity of the largest peak of the hexagonal crystal of zinc metal ($I_0$) to the peak intensity of the largest peak of the cubic crystal of MgO ($I_1$) ($I_0/I_1$) was 0.029.

In Comparative Example 2, a hexagonal crystal of ZnO (for example, a peak of 2θ=36.2 deg) was observed in addition to the cubic crystal of MgO. The peak intensity ratio of the peak intensity of the largest peak of the hexagonal crystal of ZnO ($I_0$) to the peak intensity of the largest peak the cubic crystal of MgO ($I_1$) ($I_0/I_1$) was 3.232.

Figure 3:
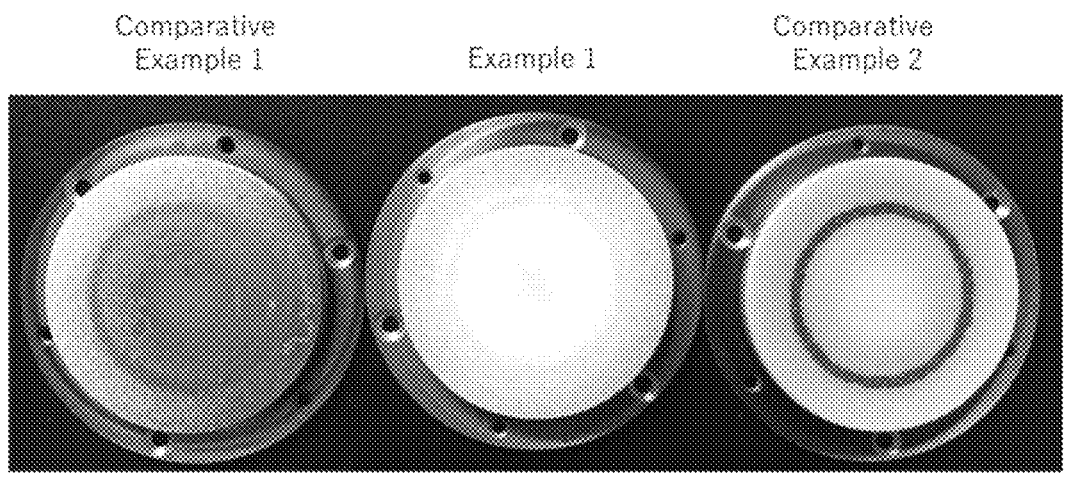
FIG. 3 shows surface photographs after film formation of the sputtering target produced in Example 1 and Comparative Examples 1 and 2.

Surface photographs after film formation of the sputtering target produced in Example 1 and Comparative Examples 1 and 2 are shown in FIG. 3. Since oxygen was uniformly distributed in the sputtering target of Example 1, stable sputtering was achieved. In addition, it can be confirmed from FIG. 3 that no surface protrusion (nodule) is generated. Examples 2 to 5 were the same as in Example 1.

On the other hand, abnormal discharge occurred during sputtering in Comparative Examples. As shown in FIG. 3, precipitation of zinc was observed in Comparative Example 1, and nodules were generated in Comparative Example 2.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A sintered body, comprising as constituent elements:
   zinc;
   magnesium; and
   oxygen,
   wherein an atomic ratio of the zinc to a sum of the zinc and the magnesium, Zn/(Zn+Mg), is in a range of from 0.25 to 0.49,
   wherein an atomic ratio of the magnesium to a sum of the zinc and the magnesium, Mg/(Zn+Mg), is in a range of from 0.51 to 0.75, and
   wherein the sintered body mainly consists of only one crystal structure determined by X-ray diffraction.

2. The sintered body of claim 1, wherein the crystal structure is a cubic crystal of MgO.

3. A tablet suitable for film formation, comprising:
   the sintered body of claim 1.

4. A sputtering target, comprising:
   the sintered body of claim 1.

5. The sintered body of claim 1, wherein the atomic ratio of the zinc is no more than 0.45.

6. The sintered body of claim 1, wherein the zinc is present in an atomic ratio in a range of from 0.25 to 0.45.

7. The sintered body of claim 1, wherein the atomic ratio of the magnesium is at least 0.55.

8. The sintered body of claim 1, wherein the magnesium is present in an atomic ratio in a range of from 0.55 to 0.75.

* * * * *